United States Patent
Di Stefano et al.

(10) Patent No.: US 7,491,069 B1
(45) Date of Patent: Feb. 17, 2009

(54) SELF-CLEANING SOCKET FOR MICROELECTRONIC DEVICES

(75) Inventors: Thomas H. Di Stefano, Monte Sereno, CA (US); Anthony B. Faraci, Georgetown, TX (US); Konstantine Karavakis, Pleasanton, CA (US); Peter T. Di Stefano, San Jose, CA (US)

(73) Assignee: Centipede Systems, Inc., San Jose, CA (US)

( * ) Notice: Subject to any disclaimer, the term of this patent is extended or adjusted under 35 U.S.C. 154(b) by 0 days.

(21) Appl. No.: 11/970,394

(22) Filed: Jan. 7, 2008

(51) Int. Cl.
*H01R 12/00* (2006.01)

(52) U.S. Cl. .......................... 439/74; 439/841

(58) Field of Classification Search ............ 439/66, 439/71, 74, 81, 841
See application file for complete search history.

(56) References Cited

U.S. PATENT DOCUMENTS

| | | | |
|---|---|---|---|
| 3,783,433 A * | 1/1974 | Kurtz et al. .................. 439/82 |
| 4,560,223 A | 12/1985 | Cooney et al. |
| 5,009,613 A | 4/1991 | Langgard et al. |
| 5,032,787 A | 7/1991 | Johnston et al. |
| 5,366,380 A * | 11/1994 | Reymond ..................... 439/66 |
| 5,391,995 A | 2/1995 | Johnston et al. |
| 5,439,393 A * | 8/1995 | Watson ........................ 439/578 |
| 5,633,597 A | 5/1997 | Stowers et al. |
| 5,936,421 A | 8/1999 | Stowers et al. |
| 5,982,187 A * | 11/1999 | Tarzwell ...................... 324/756 |
| 6,159,056 A * | 12/2000 | Boyle .......................... 439/700 |
| 6,193,524 B1 | 2/2001 | Chang |
| 6,341,962 B1 | 1/2002 | Sinclair |
| 6,377,059 B2 | 4/2002 | Vinther et al. |
| 6,720,511 B2 | 4/2004 | Windebank |
| 6,722,893 B2 | 4/2004 | Li et al. |
| 6,845,375 B1 | 1/2005 | Sinclair |
| 6,846,184 B2 | 1/2005 | Fan |
| 6,873,168 B2 | 3/2005 | Kazama |
| 6,945,827 B2 * | 9/2005 | Grube et al. ................. 439/700 |
| 7,014,473 B2 | 3/2006 | Millard |
| 7,029,288 B2 * | 4/2006 | Li ................................ 439/66 |
| 7,393,214 B2 * | 7/2008 | DiStefano .................... 439/66 |
| 2007/0197099 A1 * | 8/2007 | DiStefano ................ 439/620.1 |
| 2007/0269999 A1 * | 11/2007 | Di Stefano .................. 439/73 |
| 2008/0194124 A1 * | 8/2008 | Di Stefano .................. 439/66 |

* cited by examiner

*Primary Examiner*—James Harvey
(74) *Attorney, Agent, or Firm*—Townsend and Townsend and Crew LLP; Kenneth R. Allen

(57) ABSTRACT

A self-cleaning socket for contacting terminals on a microelectronic device wherein the first end of compliant tubular contactors rotate and wipe against terminals urged downwardly against the first end of the contactors. A rotational wipe of a contactor against a mating terminal breaks through any surface contamination layers on the terminal, thereby producing good electrical contact therebetween. Rotation of the first end of a contactor is caused by a downward deflection of a collar supported by two or more helical legs along a midsection of the contactor. Deflection of the collar distorts the resilient helical legs, each of which exerts a force on the collar which add up to produce a torsional force on the collar, thereby providing a rotational wipe in response to a downward urging of a terminal against the contactor. A void along the axis of the tubular contactor provides a reservoir to hold debris dislodged from the terminal and to keep the debris from interfering with operation of the contactor.

9 Claims, 4 Drawing Sheets

SELF-CLEANING SOCKET FOR MICROELECTRONIC DEVICES

BACKGROUND OF THE INVENTION

This invention relates to sockets used for microelectronic devices. More particularly, this invention relates to self cleaning contactors used in sockets for testing microelectronic devices with ball terminals or with flat terminals. One or more embodiments of the present invention relate to a self-cleaning electrical contactor for making electrical connections to high performance microelectronic devices, for example, and without limitation, integrated circuits ("ICs"), including microprocessors, chips for peripheral functions and RAM memories.

Sockets are used widely in electronics to burn-in and test microelectronic devices. Sockets are routinely used in systems for: (a) testing electronic device performance (an assortment of socket types have been developed to connect to a device under test ("DUT") having a wide variety of terminals and configurations), or (b) burn-in of electronic devices at elevated temperatures. A socket for burn-in or test applications will typically have a mechanical compliance that accommodates imperfections in the DUT as well as warping and non-planarity of the printed circuit board to which the socket is attached.

Prior art sockets are differentiated typically according to the type of terminals on the DUT and according to the intended end use (i.e., application). The contactors used in sockets are typically designed to make electrical connection to terminals on microelectronic devices wherein the types of device terminals contacted by sockets include pin grid arrays ("PGAs"), J-leads, gull-wing leads, dual in-line ("DIP") leads, ball grid arrays ("BGAs"), column grid arrays ("CGAs"), flat metal pads ("LAN" grid arrays or "LGAs"), and many others. In order to provide sockets for microelectronic devices with this variety of terminals, many contactor technologies have been developed for sockets. In addition to the foregoing, further differentiation among prior art sockets refers to low insertion force ("LIF") sockets, zero insertion force ("ZIF") sockets, auto-load sockets, burn-in sockets, high performance test sockets, and production sockets (i.e., sockets for use in products). In further addition to the foregoing, low cost prior art sockets for burn-in and product applications typically incorporate contactors of stamped and formed springs to contact terminals on a DUT. In still further addition to the foregoing, for high pin-count prior art sockets, a cam is often used to urge device terminals laterally against corresponding contactors to make good contact to each spring while allowing a low or zero insertion force.

For specialized applications, prior art sockets have used a wide variety of contactors, including anisotropic conductive sheets, flat springs, lithographically formed springs, fuzz buttons (available from Cinch, Inc. of Lombard, Ill.), spring wires, barrel contactors, and spring forks, among others. Prior art sockets intended for applications where many test mating cycles (also referred to as socket mount-demount cycles) are required typically use spring pin contactors of the type exemplified by Pogo® spring contacts (available from Everett Charles Technologies of Pomona, Calif.). Spring probes for applications in the electronics test industry are available in many configurations, including simple pins and coaxially grounded pins. Most prior art spring probes consist of a coil spring disposed between a first post (for contacting terminals on the DUT) and a second post (for contacting contacts on a circuit board—a device under test board or "DUT board"). Spring probes are designed to undergo 500,000 insertions before failure.

Spring probe contactors used for socketing BGA packages typically use crown tips in order to provide good contact to mating solder balls. Sharp edges of the crown tip are intended to break through any surface film on mating solder balls in order to make good conductive contact to the ball. Remnants of the surface film, including solder flux, solder oxide, organic contamination, and surface films build up contamination on the crown tip, fouling of the tip and causing unreliable contact between the contactor tip and a mating solder ball. In typical operation, spring probe contactors must be cleaned by brushing residue from the crown tips after every 10,000 to 50,000 DUT insertions in order to minimize contact failures. Fouling of crown tip contactors is responsible for economic loss due to tester down time during cleaning as well as due to false rejects resulting from contact failure. Socket cleaning and contactor failure due to contamination fouling are significant caused of tester down time in a semiconductor test facility.

Spring pin sockets typically have a plurality of spring pin contactors disposed in an array of apertures formed through a dielectric holder. By way of example, a high performance, prior art test socket may incorporate a plurality of Pogo® spring contacts, each of which is held in a pin holder with an array of holes through a thin dielectric plate. The dielectric material in a high performance, prior art test socket is typically selected from a group of dimensionally stable polymer materials including: glass reinforced Torlon 5530 available from Quadrant Engineering Plastic Products, Inc. of Reading, Pa.; Vespel; Ultem 2000 available from GE Company GE Plastics of Pittsfield, Mass.; PEEK; liquid crystal polymer; and others. The individual Pogo® spring contacts are typically selected and designed for signal conduction at an impedance level of approximately fifty (50) ohms.

The recent growth in use of BGA terminals for IC packaging has resulted in use of new and varied sockets adapted to BGA terminals for increasing terminal count and area density. BGA sockets have evolved in several directions. One type involves use of a cam driven spring wire to contact the side of each ball. Spring pins or Pogo® pins have been adapted to use in BGA sockets for certain applications in which the high cost of the socket is acceptable.

Low-cost BGA sockets for mass market applications have evolved the use of stamped and formed springs that cradle each ball of the BGA and provide some measure of mechanical compliance needed to urge a spring contactor into contact with a mating ball. Variations of stamped and formed springs are configured to use two or more formed springs to grip each ball and thereby make positive electrical contact while retaining the ball mechanically. Miniaturization and density of the mechanically stamped and formed springs are limited by present capabilities to a certain minimum size. Sockets with contactors so made are limited in density by the complexity of stamping and forming very small miniaturized springs. Further, the mechanical compliance of a stamped and formed spring is typically small in a vertical direction perpendicular to a substrate of a ball contact. Because of small compliance in a vertical direction, a miniature stamped and formed spring may be unable to accommodate motion of a contactor support relative to a ball mated to it, thereby allowing vibration, mechanical shock load and forces, flexure, and the like to cause the contactor to slide over the surface of the ball and potentially lose contact. It has also been observed that repeated microscopic motion of one contact relative to a mating contact causes fritting, that is, a build-up of small particle debris that can lead to contact failure. In addition, contamination and debris may be transferred from terminals on DUTs to mating contactors, causing a build-up of contamination on surfaces of the contactors that also lead to socket failure.

Build-up of debris on the probe from dislodged surface contamination on terminals on devices under test are a significant problem with contactors of the prior art. The contamination is typically solder flux residue, plasticizer materials, particulate contamination, organic particles, and the like. Unsuccessful attempts have been made to minimize the buildup of residue on contactor probes. One class of probes attempting to remedy the problem employs a cam action to rotate a probe plunger as the plunger is depressed. A spiral track is provided either on the plunger or on a barrel confining the plunger, wherein a cam running against the spiral track rotated the plunger as it is depressed. Rotation of the plunger caused the probe tip to wipe against a terminal biased against the probe, thereby breaking through surface contamination on the terminal. Representative patents relating to relatively large probe tips are U.S. Pat. Nos. 5,009,613; 5,032,787; and 5,633,597.

Another approach to reducing the deleterious effects of debris buildup involves the use of a hollow probe with sharp points around the circumference of the probe that cut through surface contamination on a mating terminal. The sharp points are intended to penetrate and so need not wipe against the terminal in order to cut through the surface contamination. Representative patents are U.S. Pat. Nos. 6,159,056; and 6,377,059.

Many prior art sockets are intended to provide reliable and repeatable electrical contact to electrical terminals without causing damage to either. Further, the contactors of a socket must provide a low resistance connection to mating terminals over repeated insertions of devices. In a production environment, wherein contamination and debris fouls contactors and causes test failure, periodic cleaning of the contactors of a socket is a costly and time consuming necessity. Notwithstanding the introduction of various types of contactors in test sockets, repeated socket cleaning and contact failure are continuing problems. As the number and density of terminals on microelectronic devices increases, there is an urgent and growing need for a reliable miniature contactor for test probes, i.e., one that does not fail due to contamination and that does not need repeated cleaning during production testing.

SUMMARY OF THE INVENTION

According to the invention, a miniature self-cleaning socket contactor is provided for making electrical connection to a ball grid array, a land grid array or a flat multiple-contact array of terminals on a microelectronic device. The socket contactor is a hollow cylinder constructed of a plurality of resilient helical legs supporting a collar forming a hollow contactor that rotates axially when the socket contactor is depressed. During insertion operation of the socket, each terminal on a device under test (DUT) is mated to a corresponding self-cleaning contactor, wherein each terminal is urged along the axis of the cylinder bringing the terminal into contact with the hollow contactor such that it twists, scraping at the terminal surface. Such a rotation produces a wipe of the face of the contactor against the mating terminal, thereby enhancing electrical contact therebetween. Debris dislodged from the terminal by wipe against the face of the contactor 100 does not foul the contactor surface, but rather is allowed to fall at least partially into the center cavity of the tube. Features such as serrations, edges, projections, tabs, fingers and the like may be cut into the collar to promote better contact between each feature and the terminal. Each contactor is axially compliant so as to allow the cylindrical tube to move along its axis and to assure contact with a mating terminal, thereby overcoming variations in height of the terminal due to warping, bending, and other imperfections in the device under test.

More particularly, according to one or more embodiments of the invention, the axial compliance of the cylindrical tube is effected by two or more helical legs formed by helical slots cut along a midsection of the tube, whereby the collar around the end of the tube is supported on the two or more resilient legs formed by the helical slots. A terminal urged downwardly into contact with the first end of the contactor twists the collar as it is displaced downwardly deforming the two or more helical legs supporting the collar. The plurality of legs are needed to support the collar horizontally, preventing the collar from tipping to one side as the supporting legs are deformed. More preferably, three or more legs are spaced uniformly around the circumference of the collar in order to maintain the collar level during engagement with a mating terminal.

An advantage of the present invention is provided by the debris capturing action from repeated mating of the contactor with terminals of devices under test. Debris falling into the tube of the contactor is captured within the axial cavity of the tube. In one or more embodiments of the invention, thin laser-cut slots through the tube are too narrow to allow debris of significant size to escape out through the side walls of the tube. The volume inside a tube is selected to be sufficient to hold debris for the lifetime of the contactor, obviating the need for cleaning to remove a buildup of debris during normal operation.

A socket constructed according to the invention lends to extreme miniaturization and increasing ease of manufacturing. Thus, while it may be contended that features of the present invention can be found in the prior art, none is able to be constructed with these features at the scale herein contemplated, which is a contactor having a size less than 0.5 mm (0.020 in) in diameter.

Various additional objects, features, and advantages of the present invention can be more fully appreciated with reference to the detailed description and accompanying drawings that follow.

BRIEF DESCRIPTION OF THE DRAWINGS

FIG. 2A is a perspective view of the self-cleaning contactor at rest.

FIG. 2B is perspective views of the self-cleaning contactor in operation under compression in contact with a terminal ball.

DESCRIPTION OF SPECIFIC EMBODIMENTS OF THE INVENTION

Figure 1A:
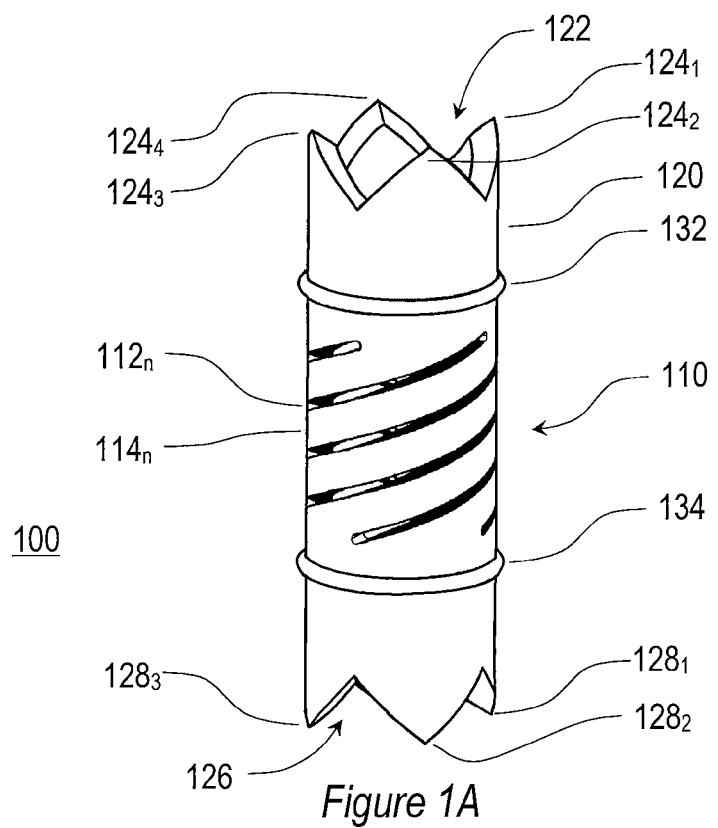
FIG. 1A is a perspective view of a self-cleaning contactor according to the invention.
Figure 1B:
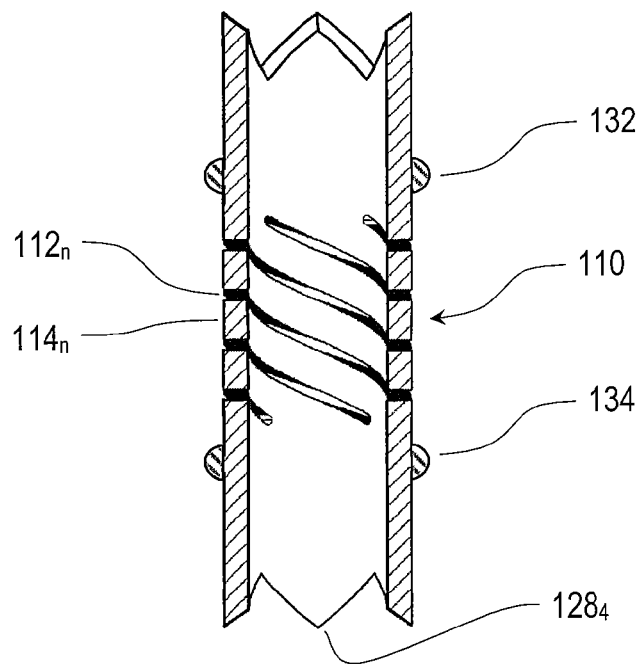
FIG. 1B is a sectional view of the self-cleaning contactor.

As illustrated by an embodiment shown in FIGS. 1A and 1B, contactor 100 comprises a hollow cylindrical electrically conductive metal tube which is cut through by a series of helical slots $112_n$ in a midsection 110 to form resilient helical legs $114_n$ that terminate in a collar 120 at the frontal end of contactor 100. In this embodiment, there are four equally-spaced legs $114_n$ (FIG. 1A). (Labels are omitted from all but one of the legs $114_n$ and slots $112_n$ for clarity of exposition.) Two or more legs $114_n$ are needed to support collar 120 horizontally and to prevent tipping of the collar when a terminal (not shown) is urged against collar 120. Legs $114_n$ are held in place by the cylindrical collar region 120 in the uncut end portion, herein called the collar 120 of contactor 100. Annular flanges or retaining rings 132 and 134 may be provided around the circumference of contactor 100 to facilitate mounting of the contactor in a socket assembly employing for example retaining sheets (292, 294 FIG. 3A). In a specific embodiment, the rings 132 and 134 are epoxy material that is painted around the circumference of contactor 100.

In accordance with one or more embodiments, contactor 100 is made from a tube of Type 304 stainless steel having an inner diameter of 250 microns and an outer diameter of 350 microns. Suitable material is hypodermic tubing stock material available from K-Tube Corporation of Poway, Calif. Four helical slots $112_n$ are cut by making 20 micron wide cut lines along a 1.0 mm (as measured along the tube axis) helical path around midsection 110 of the contactor 100 using for example a Nd-YAG laser set to a beam diameter of 20-50 microns. The total collapsible region of the sliced midsection 110 of contactor 100 is determined by the number of slots that cross along the central axis of the tube, so five slots yields 100 to 250 microns. The length of the contactor 100 is typically 2.0 mm in embodiments shown in FIGS. 1A and 1B. Preferably the total length of the contactor 100 is between 0.25 mm and 5.0 mm, and the length of the midsection 110 (as measured along the axis) of the slots $112_n$ is between 0.15 mm and 3.0 mm. Slots $112_n$ are typically cut at an angle of 60° with respect to the axis of contactor 100. Slots $112_n$ oriented at an angle of between 30° and 75° with respect to the axis of contactor 100 are within the contemplation of the invention.

After laser cutting, the tube is plated with a 4 micron thick layer of nickel and a 1.5 micron thick layer of soft gold to form a highly conductive surface for contacting a mating surface. The steel core provides sufficient axial compliance to contactor 100 to accommodate imperfections in a typical DUT. The contactor of FIG. 1A is intended to connect electrically with a terminal, such as a solder bump, a solder ball, a copper ball, a gold plated contact pad, a leadframe lead, and the like as commonly used on microelectronic devices. It is understood that this design is not intended to accommodate a pin terminal of a smaller diameter than the inner diameter of the contactor 100. A force of 10 grams is sufficient to deflect the collar 120 of contactor 100 downward by about 100 microns, thereby providing axial compliance needed to accommodate imperfections in a typical DUT.

Although the embodiment of FIG. 1A shows four legs $114_n$, it will be evident to one of skill in the art that the contactor 100 may incorporate any plurality of two or more legs as necessary to maintain collar 120 on a stable orientation in response to a compression force on the collar 120. This contrasts with a single coil spring, where the end would arguably correspond to a single leg. In such a structure, unlike the present invention, the end would tip to one side in response to a compression force and would not be able to present a level contact circumference to a mating contact. Moreover, it would not be able to maintain accurate lateral spacing. The axial compliance (stiffness) with contactor 100 depends upon the angle of the slot $112_n$, which in this embodiment is preferably at angles between 30° and 75° and more preferably between 45° and 60° as measured with respect to the axis of contactor 100. By way of example, the angle of the helical cut may be varied along the axis of the contactor 100, i.e., made steeper in the region of the midsection, in order to provide a greater rotational torque on the end of the contactor. In addition, slot $112_n$ may vary in width along the axial length of the slot.

The constituent material of contactor 100 is type 304 stainless steel of wall thickness 0.05 mm. The wall thickness of the tubing material of the contactor is selected to provide axial compliance to the contactor 100, and is preferably between 5% and 20% of the outer diameter of the tube. The thickness and material of the cylindrical tube may vary depending upon the requirements of the application. For example, the material may be selected from a group without limitation including stainless steel of various types, tempered steel, beryllium copper, phosphor bronze, copper alloys of various types, nickel tungsten alloys, nickel chromium alloys, nickel manganese alloys, nickel binary and ternary alloys, titanium alloys, and even nitinol-type alloys. (Nitinol is an acronym for Nickel Titanium Naval Ordnance Laboratory and refers to a family of inter-metallic materials which contain a nearly equal mixture of nickel and titanium and other spring materials and which exhibit temperature sensitive spring properties including shape memory and super-elasticity.) The contactor may be plated with copper, nickel, cobalt, palladium, gold, and alloys thereof, as well as other films. A high strength coating, for example and without limitation including Ni—W alloys, Ni—Co alloys, Ni—Cr alloys, Ni—Mn alloys, Ni—V alloys and combinations thereof, may be used to further strengthen the material of the tube. In further embodiments, a contactor lubricant may be applied to the surface of the contactor to reduce fritting and improve lifetime of the contactor.

The helical feature of the self-cleaning contactor 100 of the invention may be fabricated by means including but not limited to laser cutting of tubular material, plasma etching of tubular material, pattern etching of tubular material, pattern plating of sacrificial wire material, and combinations thereof. The tubing of the contactor is typically a cylinder of circular cross section, although oblong, square, or polygonal cross section tubes are also within contemplation of the invention. For example, the tube may be a cylindrical tube of circular cross section that has been flattened on four sides. Laser annealing, flash annealing, ion beam treatment, pickling, quenching, heat treating and other treatments known in the art may be used to improve properties of the spring material of the contactor.

An alternative method for manufacturing the contactor 100 according to the invention is electroplate a metal such as high-strength nickel alloy, such as nickel-tungsten (Ni—W) alloys, nickel-cobalt (Ni—Co) alloys, nickel chromium (Ni—Cr) alloys, nickel-manganese (Ni—Mn) alloys, nickel-vanadium (Ni—V) alloys or combinations thereof. The contactor is formed by etching or pattern plating of the electroplated metal to form the contactor.

Figure 2C:
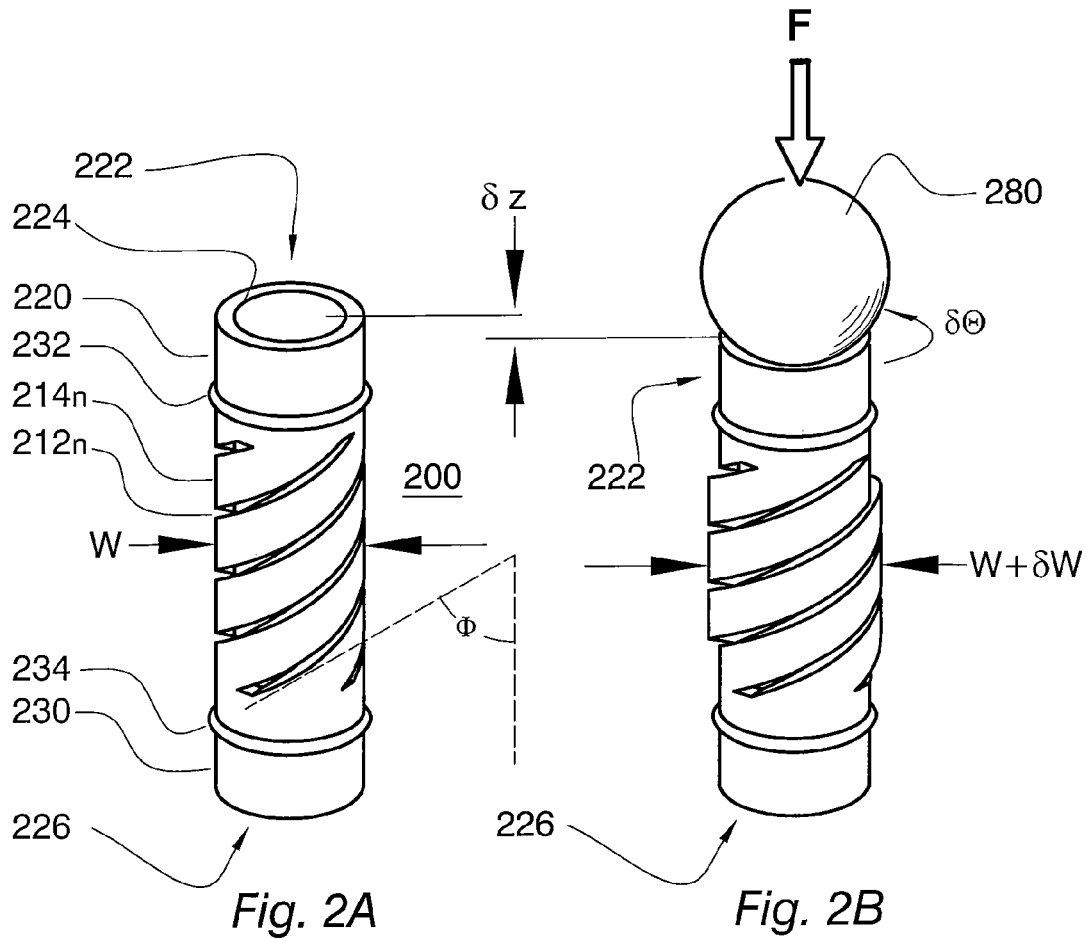
FIG. 2C is a sectional view of the contactor of FIG. 2A.
Figure 2C:
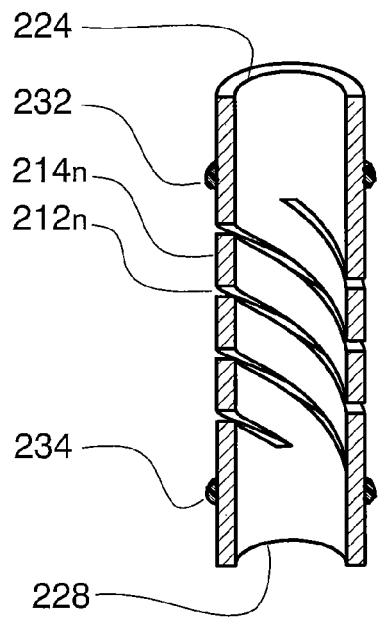

Further advantages accrue in embodiments of the invention in which a contactor is provided in which each of the two ends is interchangeable or otherwise equivalent. FIGS. 1A and 2A are embodiments of the present contactor in which the second end is equivalent to the first end in that the contactor surface touching the mating terminal is substantially the same for the first end of the contactor mating to the terminal as for the second end mating to the same terminal. By way of the example illustrated in FIG. 1A, four serrations $124_1$-$124_4$ arrayed circumferentially around the first end 122 of contactor 100. Correspondingly, four similar serrations $128_1$-$128_4$ are arrayed circumferentially around second end 126 of contactor 100.

Equivalence or complementariness of the first end 122 and second end 126 may be achieved by cutting a pattern through the second end of a tube that is a mirror image of the pattern cut through the first end of the tube. The pattern may be mirrored by a plane perpendicular to the axis of the tube as in FIG. 2A. Alternatively, the pattern may be mirrored around a point on the axis of the tube as in FIG. 2A. Additionally, the second pattern may be rotated about the axis with respect to the first pattern without substantially changing equivalence of the operation of the first and the second pattern. As an alternative to the serrated edge cut pattern of first end 122 of contactor 100, patterns that may be used for the first end include filigree patterns cut around the circumference of the tube, a pattern of circumferential slots cut around the first end of the tube, a pattern of oblique feathered slots cut into the first end of the tube, a pattern of loops cut into the first end of the tube, and the like.

Double-ended contactors of FIGS. 1A and 2A offer significant manufacturing advantages in the assembly of such contactors into arrays. Individual contactors may be inserted into an array of holes in a carrier sheet by automated equipment without the need for examining and orienting the contactor in either an up or down orientation. FIG. 1A is a double-ended contactor in which four serrations $124_1$-$124_4$ are cut into first end 122 and four serrations $128_1$-$128_4$ are cut into second end 126. Contactor 100 may be mounted in an array with the first end 122 oriented up to as to mate with a terminal. Alternatively, contactor 100 may be mounted in an array with the second end 126 oriented up so as to mate with a terminal, thereby providing an equivalent contactor to that with end 122 oriented up. Although a double-ended contactor with equivalent ends provides advantages in simplifying manufacturing assembly, one skilled in the art will appreciate that a double-ended contactor of this invention need not have ends that are mechanically equivalent. For example, in certain applications it is desirable that one end of a contactor remain firmly attached to a mating post while the opposite end is easily disengaged from its mating terminal. High performance contactors for these certain applications will have a first and a second end that are not mechanically equivalent.

A theory of operation of one or more embodiments of a self-cleaning contactor 200 according to the invention is illustrated in FIGS. 2A-2C and FIGS. 3A-3C. Contactor element 200 comprises a hollow metal tube into which helical slots $212_1$-$212_4$ are cut through the wall of the tubular body of contactor 200 along a portion of the midsection of the contactor 200. A sharp inner edge 224 is disposed at first end of contactor 200. Correspondingly, a sharp inner edge 228 is disposed at second end 226 of contactor 200. In accordance with one or more preferred embodiments, contactor 200 is made from a tube of Type 304 stainless steel having an inner diameter of 300 microns and an outer diameter of 400 microns. Slots $212_1$-$212_4$ form a plurality of legs $214_1$-$214_4$ that connect collar 220 at the first end 222 to collar 230 at the second end 226 of contactor 200. Each of legs $214_1$-$214_4$ spirals around a midsection of contactor 200, forming an angle of Φ with respect to the axis of the contactor. Preferably, legs $214_1$-$214_4$ are disposed symmetrically around the body of the contactor so as to provide legs of uniform dimension. Collar 220 sits upon the plurality of legs $214_1$-$214_4$ attached thereto. Edge 224 along the inner diameter at first end 222 is operative to make contact with a mating terminal 280. For clarity of exposition, label $212_n$ is representative of labels $212_1$-$212_4$ label $214_n$ is representative of labels $214_1$-$214_4$, and selected ones of the numerical labels are omitted from the elements also shown in FIGS. 2B-2C and 3A-3C.

Annular rings 232 and 234 encircle the tubular body of contactor 200 at positions proximal to first end 222 and proximal to second end 226 respectively. Rings 234 and 236 are made of epoxy polymer or other insulative material. The function of rings 232 and 234 is to retain physically the contactor 200 in a hole in a dielectric sheet. Alternatively, annular ring 232 or ring 234 may be a plated metal ring, an upset flange on the tubular body, an embossed ring, an etched detent ring, and the like, formed by processes well known in the art.

Operation of embodiments of the invention is illustrated in FIG. 2B, showing terminal 280 urged by force F onto first end 222 of contactor 200. Terminal 280 is a solid metal ball of lead-free tin-silver alloy, such as $Sn_{95}Ag_5$. Terminal 280 is well suited for mating with contactor 200, as sharp edge 224 cuts into the side of the ball of terminal 280 in a circular contact area. Terminal 280 may also be a spherical ball of metal such as without limitation lead-tin solder, brass, bronze, stainless steel, carbon steel, copper, silver, nickel and alloys thereof. Terminal 280 may be coated with thin films of nickel, Monel (a trademark of Special Metals Corporation of New Hartford, N.Y., for select copper-nickel alloys), gold, palladium, silver, rhodium, osmium, and alloys thereof to protect the ball against corrosion. Alternatively, the terminal may be a flat contact pad of copper with a coating of nickel and gold, or other suitable metal for electrical contact pads.

As terminal 280 is urged onto contactor 200, the first end of the contactor 200 is compressed a small distance δz as the helical legs $214_1$-$214_4$ are deformed by the total compressive force F. Compression of the contactor 200 provides axial compliance that allows each of the contactors in an array to make positive electrical contact to a corresponding mating terminal. In addition to an axial compression, deformation of each of the plurality of legs $214_1$-$214_4$ causes first end 222 of contactor 200 to rotate by a small angle δΘ about its axis with respect to second end 226. Angular rotation 60 of first end 222 moves edge 224 to wipe across terminal 280, thereby making fresh metallic contact therebetween. The angular rotation δΘ of collar 220 causes sharp edge 224 to cut cleanly into the side of terminal 280 to effect a good electrical contact thereto. Rotation δΘ is due to deformation of legs $214_1$-$214_4$ as they are compressed in a direction along the axis of contactor 200. In addition to rotation, the legs $214_1$-$214_4$ distend and thereby increase the diameter around the midsection of contactor 200 by δW. The shape of slots $212_1$-$212_4$ is adjusted to provide a rotation δΘ at a minimum increase δW in the diameter of contactor 200 at its midsection. Preferably, the slots $212_1$-$212_4$ are helical cuts at an angle of between 30° and 75° with respect to the axis, and more preferably at an angle between 45° and 60° with respect to the axis.

Figures 3A, 3B, 3C:
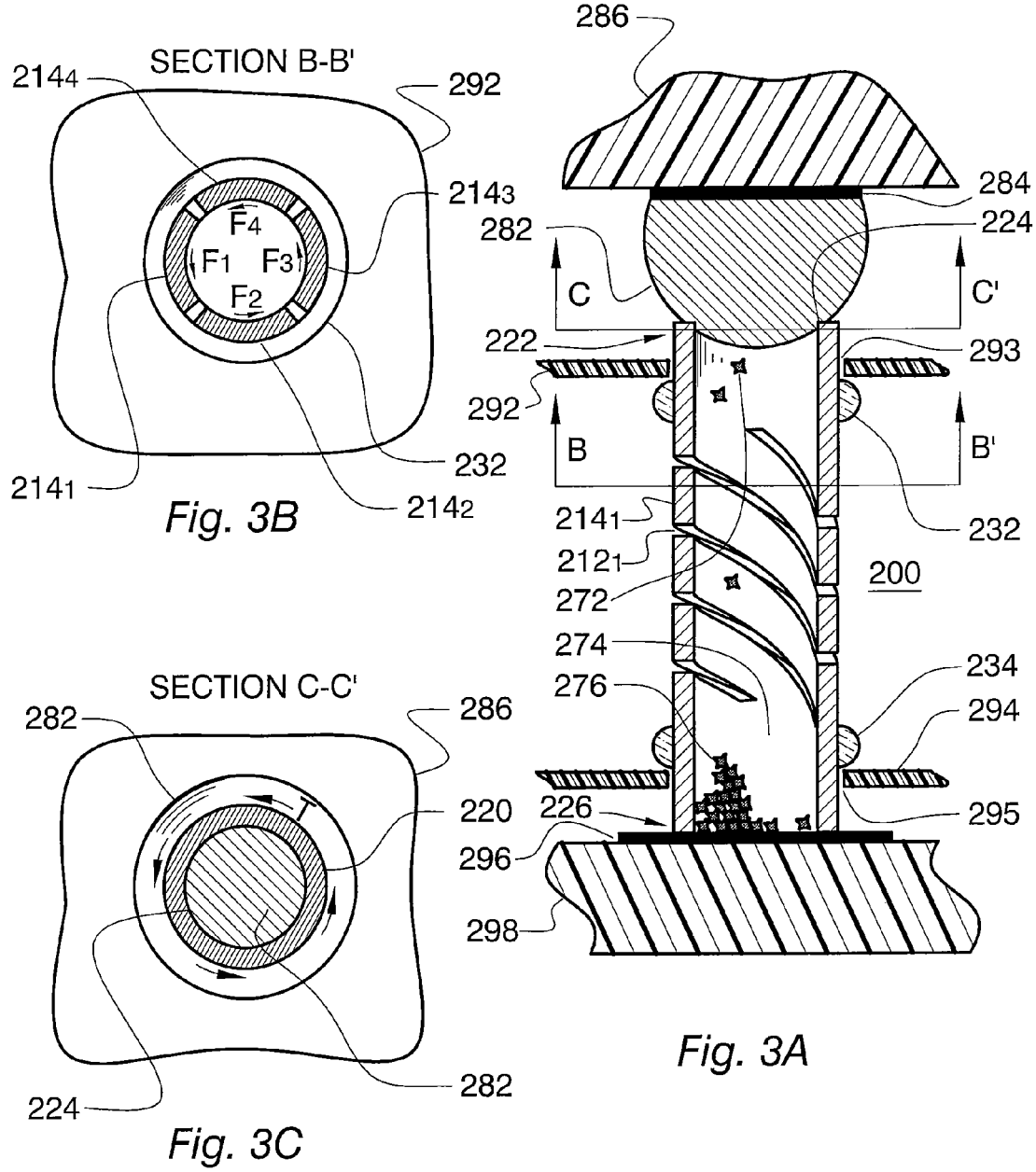
FIG. 3A is a sectional view of a self-cleaning contactor in operation in contacting a solder ball terminal.
FIG. 3B is a detailed sectional view of the self-cleaning contactor of FIG. 3A.
FIG. 3C is a further detailed sectional view of the self-cleaning contactor of FIG. 3A.

Details of the operation of embodiments of the invention is described in reference to FIG. 3A, showing terminal 282 being urged onto first end 222 of contactor 200. Terminal 282 is a solid bump of lead free $Sn_{95}Ag_5$ solder, as in terminal 280 of FIG. 2B, where solder ball 280 is attached by solder reflow to pad 284 on microelectronic device 286 (FIG. 3A). As terminal 282 is urged into the end 222 of contactor 200, edge 224 of contactor 200 cuts into the side of the terminal and removes surface debris to reveal a fresh surface whereby good contact is made between terminal 282 and contactor 200. Surface debris particles 272 fall primarily into central cavity 274 of contactor 200. Debris 276 accumulates in the central cavity 274, out of the way of the contacting surface 224. Further, as terminal 282 is urged into engagement with contactor 200, the axial force on first end 222 of the contactor 200 causes first end 222 to rotate around the axis of the contactor 200 and thereby wipe contact edge 224 against the surface of the mating terminal 282. This rotational wiping action helps to dislodges surface contamination and debris from the terminal and allows enhanced contact between edge 224 and a fresh metal surface on terminal 282.

The rotational wiping of edge 224 against terminal 282 is better understood by reference to section B-B' in FIG. 3B, and C-C' in FIG. 3C. Section B-B' shows a section through the four legs $214_1$-$214_3$ of contactor 200. A force $F_1$ acts on leg $214_1$. Correspondingly, forces $F_2$, $F_3$, and $F_4$ act on legs $214_2$, $214_3$ and $214_4$ respectively. Legs $214_1$-$214_4$ transmit forces $F_1$-$F_4$ to first end 222. The vectorial sum of forces $F_1$-$F_4$ is zero, and thus the net translational force acting on collar 220 at first end 222 is zero so that the contactor does not exert a net force that may push the mating terminal out of alignment with terminal 282. However, the forces $F_1$-$F_4$ transmitted to collar 220 at first end 222 exert a torsion on the collar 220 of T=(F1+F2+F3+F4)×R, where $F_1$-$F_4$ are the values of the forces acting on the legs $214_1$-$214_4$ respectively, and R is a mean distance or the legs $214_1$-$214_4$ from the axis of the contactor 200. Two or more legs $214_1$-$214_n$ are necessary in order to provide torsion around the axis of first end 224 without exerting a lateral force that may misalign the first end 222 with respect to terminal 282. The torsion exerted on collar 220 causes a rotational motion as shown in section C-C' of FIG. 3C. Torsion on the collar 220 acts so as to cause the collar 220 to rotate relative to terminal 282, and thereby to cause wipe of sharp edge 224 against the surface of terminal 282. Wipe of the edge 224 cleans away contamination from the surface of terminal 282, while debris particles 272 fall into the central void 274, thereby allowing contactor 200 to operate in a self cleaning mode and to function unencumbered by contamination. Debris falling outside the contactor 200 are not expected to foul operation of contactor 200.

Contactor 200 is held in a vertical orientation by a first carrier sheet 292 and a second carrier sheet 294. Contactor 200 is prevented from removal vertically upward by interference of annular ring 232 with hole 293 in carrier sheet 292. The outer diameter of annular ring 232 is 475 microns, slightly larger than the 450 micron diameter of hole 293. Correspondingly, contactor 200 is prevented from removal vertically downward by interference of annular ring 234 with hole 295 in second carrier sheet 294. Diameters of annular rings 232 and 234 are slightly larger than the diameters of the holes 293 and 295 respectively. Second end 226 of contactor 200 is in electrical communication with gold plated copper pad 296 on FR-4 circuit board 298.

Figure 4A:
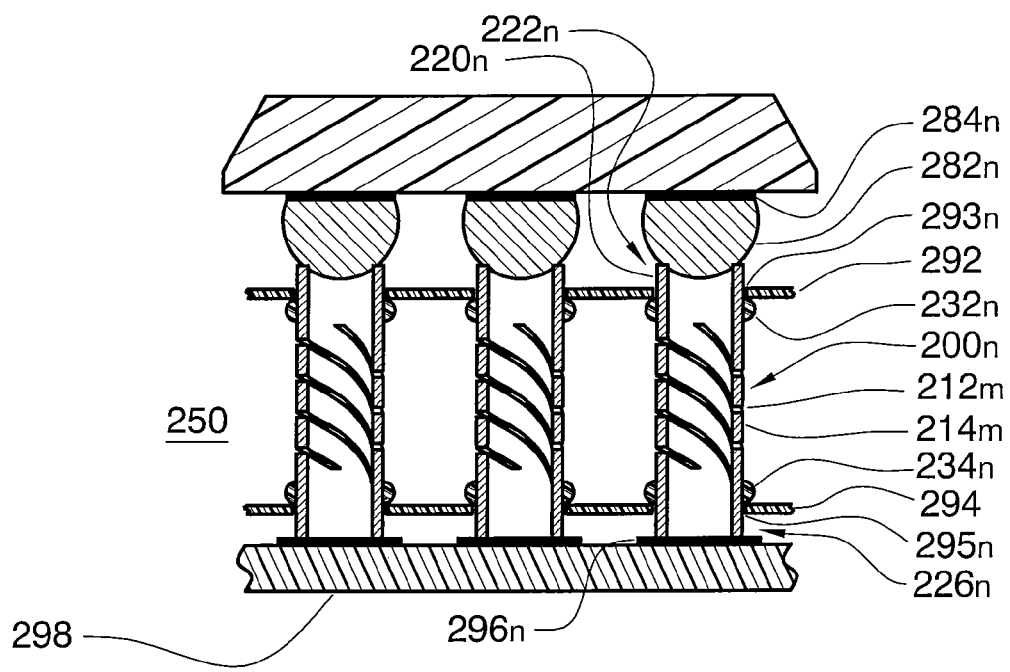
FIG. 4A is a sectional view of a BGA device on a self-cleaning socket wherein the contactors are held in place by distal alignment sheets.

A plurality of contactors 200 of FIG. 3A may be assembled into an array to form a socket for contacting a microelectronic device, as is shown in FIG. 4A. Each of contactors $200_n$ is held within a hole $293_n$ in carrier sheet 292, whereby first end $222_n$ of contactor $200_n$ extends upward perpendicularly through hole $293_n$ in first carrier sheet 292, and second end $226_n$ extends downward perpendicularly through hole $295_n$ in second carrier sheet 294. The body of contactor 200 is 2.0 mm long, with an inner diameter of 300 microns and an outer diameter of 400 microns. Each contactor $200_n$ is loosely held within first carrier sheet 292 and second carrier sheet 294 by annular retaining rings 292 and 294, respectively, each at a distance of 600 microns from the center of contactor $200_n$. Carrier sheets 232 and 234 comprise metal sheets of 0.05 mm thick Be—Cu alloy 172 that are coated with a 20 micron thick insulating polymer. Alternatively, carrier sheets 292 and 294 comprise 50 micron thick sheets of polyimide into which 450 micron diameter holes $293_n$ and $295_n$ are drilled respectively.

Each of contactors $200_n$ is held within holes in carrier sheets 292 and 294, whereby first ends $222_n$ of contactors $200_n$ extend upward perpendicularly from the carrier sheet and second ends $226_n$ extends downward from the carrier sheet 294. Each of contactors $200_n$ is a stainless steel 304 tube with four helical slots $212_1$-$212_4$ along its midsection, thereby forming legs $214_1$-$214_n$ from a collar 220 at a first end of each tube and extended toward a second end 226 of the tube. Slots $212_1$-$214_4$ are for example 0.050 mm wide slices made by a Nd-YAG laser through a 0.05 mm thick wall of the tube. In a typical embodiment, slots $212_1$-$212_4$ are slanted at an angle of about 40° with respect to a plane perpendicular to the longitudinal axis of the tube. The tube of contactor $200_n$ is 2.0 mm long, with an inner diameter of 300 microns and an outer diameter of 400 microns. (Repetitious label numbering is omitted from FIGS. 4A and 4B for clarity of exposition. Additionally, a representative one of slots $212_1$-$212_4$ is labeled $212_m$, and a representative one of legs $214_1$-$214_4$ is representatively labeled $214_m$.)

In FIG. 4A, carrier sheets 292 and 294 hold an array of contactors $200_n$ in predetermined positions of an array of a self-cleaning socket 250. In addition to the construction of an embodiment described above, it will be understood by one of ordinary skill in the art that other configurations of a carrier sheet may be used to hold contactors of the invention. By way of example, carrier sheets 292 and 294 may comprise; one or more layers of dielectric material G-10, Ultem® (available from GE Polymers), glass reinforced epoxy, metal reinforced epoxy, liquid crystal polymer materials, and other polymers; and one or more adhesive materials including but not limited to B-staged epoxy, FEP, PFA, Ultem®, acrylics, PTFE, polyethylene, polyamide, and polyamide blends. The adhesive material may be used in sheet form; in layered form such as bondply laminates; in stencil printable paste such as B-staged epoxy available from CTI, Inc. of Baltimore, Md. in dispensable adhesive materials; and other adhesive materials known in the art. The carrier sheet may be further be formed by embossing, punching, drilling, stretching, and mechanical shaping to fit specific applications.

In further variants, carrier sheets 292 and 294 may include one or more metal layers that may provide thermal conductivity, ground plane connections, power plane connections, electromagnetic shielding, control of thermal expansion, mechanical rigidity, intra-connector shielding, impedance control of contactors, pressure seals, integral capacitors between metal layers, radiation shielding, means for mounting for discrete components, substrates for additional wiring layers, over-voltage protection grounding, stress relief springs, and other electrical functions. The carrier sheets may be of any sheet thickness, including a first metal layer that extends from the first end of contactor $200_n$ toward the midsection and a second metal layer that extends from the second end of contactor $200_n$. Such thick metal layers are used to provide shielding of one contactor $200_n$ from other contactors $200_m$ toward the mid-section. By way of example, the diameter of through holes may vary, with a first hole diameter for power and ground contactors and a second hole diameter for signal contactors. A metal layer may be connected to selected ones of the contactors $200_n$ by means known in the art including without limitation, spring actuated contact, soldering, thermo-sonic bonding, laser welding, conductive adhesive joining, press fit mounting, and diffusion bonding. A metal layer may be insulated from other ones of contactor $200_n$ by means of an insulating sleeve on the mid-section of the contactor, a dielectric coating on the metal layer, an electrodeposited dielectric coating on the metal layer, dielectric adhesive material, an air gap, and other insulative means known in the art. Selected ones of the metal layers may be connected to circuits that provide power, ground, signals, clock timing, chassis ground and other electrical means.

Figure 4B:
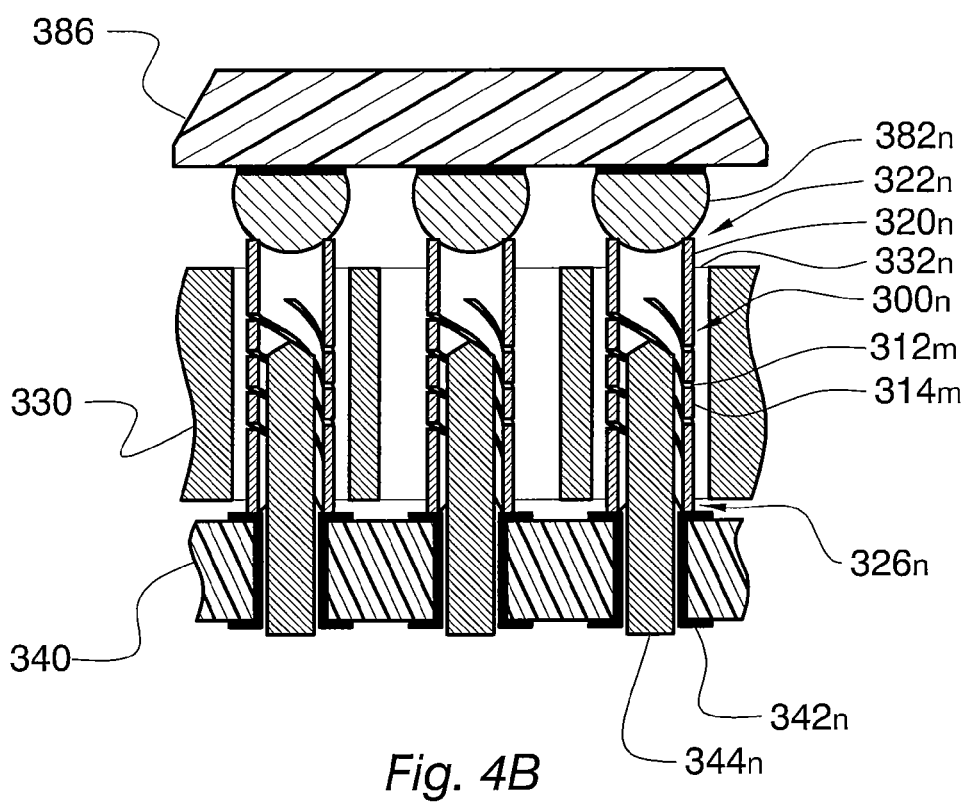
FIG. 4B is a sectional view of a BGA device on a self-cleaning socket wherein the contactors are held in place by alignment pins.

Yet another embodiment of a self-cleaning socket is shown in FIG. 4B, in which contactors $300_n$ are held in position in an array by pins $344_n$ that fit within the inner diameter of contactors $300_n$. Pin $344_n$ extends upward to the midsection of the contactor $300_n$, thereby holding the contactor $300_n$ upright and in place. Pins $344_n$ are gold plated copper wire of a diameter slightly less than the inner diameter of the contactor $300_n$ so as to avoid interference with vertical deflection of the contactor. Pin $344_n$ is attached into plated through hole $342_n$ in circuit board 340 by solder or the like. Each contactor $300_n$ comprises a metal tube into which two or more slots $312_m$ are cut through the wall of the tube in a helical pattern around a midsection of the tube. Preferably, slots $312_m$ are disposed symmetrically around the axis of the tube thereby forming legs of equal proportions that support collar $320_n$ around first end $322_n$ of the contactor. Helical legs $314_m$ provide a vertical compliance to the contactor wherein a ball grid array (BGA) microelectronic device 386 is urged onto the socket causing an axial deflection of first end $322_n$. The compressive axial deflection also produces a rotation of collar $320_n$ around the axis whereby first end $322_n$ wipes rotationally against terminal $382_n$. As in the operation of contactor 200 of FIG. 3A, wipe of first end $322_n$ of contactor $300_n$ breaks through any surface contamination on terminal $382_n$ thereby providing good electrical connection therebetween. Debris dislodged by the rotational wipe is held within the void along the axis of contactor $300_n$. In the array of contactors $300_n$, each contactor may be shielded from its neighbors by a metal mesh 330 in which holes $332_n$ accommodate contactors $300_n$. The diameter of each hole $332_n$ depends upon the desired impedance level for the corresponding contactor $300_n$.

The invention has been explained with reference to specific embodiments. Other embodiments will be apparent to those of ordinary skill in the art. One of ordinary skill in the art would recognize many variations, modifications, and alternatives. It is therefore not intended that this invention be limited, except as indicated by the appended claims.

What is claimed is:

1. A self cleaning socket for promoting reliable electrical contact to terminals on a microelectronic device, said socket comprising:
   a carrier sheet with an array of holes disposed therethrough; and
   a plurality of miniature metal tubes disposed in said holes in said carrier sheet, each tube having a midsection disposed between a first end and a second end, a collar at least said first end and at least two helical slots disposed at an angle to the axis of said tube through said midsection forming at least two resilient helical legs that support said collar on axis of said tube;
   whereby an axial compressive force on said first end causes said collar at said first end to rotate about its axis by an amount sufficient to cause a wiping action of said first end against a mating terminal.

2. A self cleaning contactor for making electrical connection to a terminal on a microelectronic device, said contactor comprising:
   a miniature metal tube, said tube having a midsection disposed between a first end and a second end, a collar at least said first end and at least two helical slots disposed at an angle to the axis of said tube through said midsection forming at least two resilient helical legs that support said collar on axis of said tube;
   whereby an axial compressive force on said first end causes said collar at said first end to rotate about its axis by an amount sufficient to cause a wiping action of said first end against a mating terminal.

3. The self cleaning contactor according to claim 2 wherein said helical slots are oriented at an angle of between 20 degrees and 60 degrees with respect to the axis of said tube.

4. The contactor according to claim 3 wherein said collar has a sharp inner edge for engaging and scraping said mating terminal.

5. The contactor according to claim 2 wherein said collar has a sharp inner edge for engaging and scraping said mating terminal.

6. The contactor according to claim 2, wherein the angle of said helical slots is varied along the axis of said tube in order to provide a greater rotational torque on the first end of the contactor.

7. The contactor according to claim 2, wherein the width of said helical slots is varied along the length of said helical slots.

8. A self cleaning contactor for making electrical connection to a terminal on a microelectronic device, said contactor comprising:
   a cylindrical metal tube of small size to accommodate a circuit contact surface of said terminal, said tube having with a first end and a second end;
   a plurality of helical slots disposed at a midsection of a length of said tube;
   wherein a first end of each of said slots terminates at a first cylindrical collar encircling said first end of said tube;
   wherein a second end of each of said slots terminates at a second cylindrical collar encircling said second end of said tube, such that under compression of said tube said first collar rotates with respect to at least said second collar; and
   wherein said tube forms a receptacle for debris generated by wipe of said first end against said terminal.

9. A self cleaning socket for making electrical connection to terminals on a microelectronic device, said socket comprising:
   a plurality of contactors in an array, each said contactor comprising:
      a cylindrical metal tube of small size to accommodate a circuit contact surface of said terminal, said tube having with a first end and a second end;
      a plurality of helical slots disposed at a midsection of a length of said tube;
      wherein a first end of each of said slots terminates at a first collar encircling said first end of said tube;
      wherein said tube forms a receptacle for debris generated by wipe of said first end against said terminal; and
   a plurality of pins mounted on a substrate, each said pin retaining a corresponding contactor,
   wherein a second end of each of said slots terminates at a second collar encircling said second end of said tube and encircling said corresponding pin.

* * * * *